(12) United States Patent
Kang et al.

(10) Patent No.: US 6,894,517 B2
(45) Date of Patent: May 17, 2005

(54) METHOD FOR MONITORING OXIDE QUALITY

(75) Inventors: Ting-Kuo Kang, Kao-Hsiung Hsien (TW); Yi-Fan Chen, Tai-Chung (TW); Chia-Jen Kao, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 135 days.

(21) Appl. No.: 10/065,432

(22) Filed: Oct. 17, 2002

(65) Prior Publication Data

US 2004/0077110 A1 Apr. 22, 2004

(51) Int. Cl.$^7$ .............................................. G01R 31/02
(52) U.S. Cl. ...................................... 324/765; 324/766
(58) Field of Search ....................... 438/5–18; 324/765, 324/557, 558, 71.1, 71.5, 766

(56) References Cited

U.S. PATENT DOCUMENTS 6,583,641 B2 * 6/2003 Wang et al. ................ 324/765

* cited by examiner

*Primary Examiner*—Evan Pert
(74) *Attorney, Agent, or Firm*—Winston Hsu

(57) ABSTRACT

The present invention utilizes to wafer acceptance testing equipment to fast monitor the quality of a tunnel oxide layer. First, a control gate and a floating gate in a memory cell are electrically connected. Then a plurality of swing time-dependent DC ramping voltages are applied and each corresponding gate leakage current is measured to calculate each corresponding β value. Finally a ratio of each β value is calculated and a β-gate voltage curve is plotted to actually simulate the device failure.

43 Claims, 7 Drawing Sheets

METHOD FOR MONITORING OXIDE QUALITY

BACKGROUND OF INVENTION

1. Field of the Invention

The present invention provides a method for monitoring oxide quality, and more particularly, relates to a method for quickly monitoring the stress-induced degradation of an oxide layer in a memory cell or in a metal-oxide-semiconductor (MOS) with wafer acceptance testing (WAT) equipment.

2. Description of the Prior Art

In today's electronics industry, semiconductor devices make extensive use of the unique characteristics of semiconductor materials. Most recently, transistors known as metal-oxide-semiconductor (MOS) transistors have been created that consume less power and can be highly integrated. These tiny transistors have been widely used in various electronic devices and circuits. Non-volatile memory, such as the frequently seen flash ROM or other electrically erasable programmable ROM (EEPROM), is one kind of memory. Once information or data is stored into the non-volatile memory, the stored information or data will not disappear due to the interruption of power supply. The non-volatile memory thus is able to retain data and becomes a key component in the electronics industry.

Flash ROM, regarded as one kind of non-volatile memory, usually utilizes a floating gate composed of polysilicon or metal for storing charges. Therefore, an extra gate exists aside from a typical control gate when compared with MOS. Please refer to FIG. 1A and FIG. 1B. FIG. 1A and FIG. 1B are schematic diagrams of writing and erasing a flash ROM cell 10. As shown in FIG. 1, the flash ROM cell 10 is fabricated on a semiconductor substrate 12. The flash ROM cell 10 comprises a floating gate 14 and a control gate 16. Two N-type doping areas 18 are set in the semiconductor substrate 12 at two sides of the floating gate 14 and the control gate 16, and a channel 22 is defined between the two N-type doping areas 18.

When writing to the cell, hot electrons tunnel through a thin silicon dioxide layer (not shown) beneath the floating gate 14, enter the floating gate 14, and are trapped in the floating gate 14. Storing negative charges in the floating gate 14 represents storing a data "1" in the flash ROM cell 10, as opposed to storing a "0". To electrically erase a memory state of the flash ROM cell 10, adequate negative voltage must be applied to the control gate 16 of the flash ROM cell 10. The electrons trapped in the floating gate 14 tunnel through the thin silicon dioxide layer (not shown) beneath the floating gate 14 again, and escape from the floating gate 14. The data stored in the flash ROM cell 10 is erased, the state before storing information is recovered, and new information can be written into the flash ROM cell 10.

However, when electrons or holes flow through the channel, they are apt to be affected by an electric field and gain energy to become a so-called hot carrier. These energetic hot carriers will alter their original path and be injected into the oxide layer to become oxide-trapped charges ($N_{ot}$), to drift through the oxide layer and cause leakage current flowing through the gate ($I_G$), to create interface-trapped charges ($D_{it}$), and to generate photons. Both the oxide-trapped charges and the interface-trapped charges cause a threshold voltage shift and mobility degradation. The voltage applied to the gate creates a voltage difference ($V_{ox}$) traverse the oxide layer. An effect frequently observed in electric field stressed oxides is a gate oxide current increase, referred to as stress-induced leakage current (SILC).

The most likely mechanism causing this current increase is trap-assisted tunneling where electrons or holes tunnel from the substrate to the gate through intermediate oxide traps. These traps are generated by the high-field stress and they facilitate electrons or holes tunneling to enhance the current. The intermediate trapped charges comprise not only the previous mentioned oxide-trapped charges and the interface-trapped charges, but also the fixed oxide charges resulting from structural defects and mobile charges generated by sodium (Na), lithium (Li), and potassium (K) ions. Stress-induced leakage current degrades data retention of non-volatile memories, causes problems during the writing and erasing of non-volatile memories and results in reliability issues.

The progress of science and technology has led to continual improvements in the performance of electronic systems and circuits. These improvements have fueled the increased demand for MOS transistors. In a MOS transistor, one of the most basic and critical requirements for proper operation is a stable threshold voltage. If the threshold voltage of a MOS transistor is unstable or out of spec, the turn-on and turn-off of the MOS transistor become abnormal and further affect the accuracy of the operation of an integrated circuit. Therefore, industry develops many methods to accurately judge the quality of oxide.

Please refer to FIG. 2A and FIG. 2B, FIG. 2A and FIG. 2B are resultant diagrams for judging the oxide quality by utilizing a C-V method according to the prior art. The C-V method, if taking an n-channel MOS device formed on a P-type substrate as an example, is to apply a swing time-dependent ramping voltage to the gate, from negative biased voltage to positive biased voltage. Due to the change of the voltage value, the surface of the P-type substrate underneath the gate varies through an accumulation mode, a depletion mode, and an inversion mode. The charge distribution is thus correspondingly changed. As shown in FIG. 2A, the total capacitance of a MOS capacitor C is regarded as a series combination of the gate oxide layer capacitance ($C_O$) and the semiconductor depletion-layer capacitance ($C_j$). Since C=dQ/dV, the change of charge distribution results in the change of the MOS capacitor C. By observing the typical C-V curve, the change of charge distribution under different modes is realized and the threshold voltage ($V_T$) for MOS is found.

As shown in FIG. 2B, the fixed oxide charges, the mobile charges, the oxide-trapped charges and the interface-trapped charges cause a C-V curve shift. The ideal C-V curve (a) affected by the fixed oxide charges, the mobile charges, and the oxide-trapped charges, is shifted toward left or right to become the C-V curve (b). Since the interface-trapped charges varies with the surface potential of the semiconductor ($\bar{O}_S$) the ideal C-V curve (a), affected by the interface-trapped charges, is not only shifted toward left or right but is also distorted to become the C-V curve (c).

FIG. 3 is a schematic diagram of the charge pumping method for judging the oxide quality according to the prior art. As shown in FIG. 3, if taking an NMOS device 34 formed on a P-type substrate 32 as an example, the charge pumping method is to tie a source 36 and a drain 38 of the NMOS 34 together first. The tied source 36 and the drain 38 are slightly reversed biased with voltage $V_R$. A square-wave pulse train with a specific period is then applied between a gate 42 of the NMOS 34 and the P-type substrate 32. The square-wave pulse voltage is of sufficient amplitude for the channel 44, on a surface of the P-type substrate 32 underneath the gate 42, to be driven into an inversion mode at positive half cycle or an accumulation mode at negative half cycle. The interface traps (not shown) are continuously distributed through the band gap between the valence band and the conductive band.

When the square-wave pulse applied between the gate 42 and the P-type substrate 32 falls from a positive value to a negative value, electrons in the channel 44 during an inversion mode drift to both the source 36 and the drain 38. In addition, electrons captured by those interface traps near the conduction band are thermally emitted into the conduction band and also drift to the source 36 and the drain 38. Electrons captured by those interface traps do not have sufficient time to be thermally emitted and remain captured by the interface traps. Once the hole barrier is reduced, holes that flow to recombine with the electrons captured by those interface traps do not have sufficient time to be thermally emitted. When the square-wave pulse applied between the gate 42 and the P-type substrate 32 returns from the negative value to the positive value, holes captured by those interface traps near the valence band are thermally emitted into the valence band. Holes captured by those interface traps do not have sufficient time to be thermally emitted and remain captured on interface traps until recombining with electrons flowing in from the source 36 and the drain 38.

Hence, those electrons on interface traps within the energy interval $\Delta E$ recombine with the holes. If the electron density (electrons/cm$^2$) flowing into the inversion layer from source/drain is $Q_N/q$, the electron density flowing back into the source/drain is only $(Q_N/q - D_{it}\Delta E)$ ($D_{it}$ is interface trapped charge density, unit: cm$^{-2}$.ev$^{-1}$). $D_{it}\Delta E$, the difference, recombine with the holes. Relatively speaking, $D_{it}\Delta E$ more holes flow into the P-type substrate 32 than leave, giving rise to the charge pumping current ($I_{cp}$). A capacitor in parallel with the ammeter for measuring the charge pumping current averages the charge pumping current. Furthermore, if the period of the square-wave pulse is long enough so there is sufficient time for carriers to tunnel to the traps inside the oxide layer, the charge pumping method is utilized to measure the trapped charge density inside the oxide layer 46. The resultant charge-pumping-current versus gate-voltage ($I_{cp}V_g$) curve is shifted from a curve produced by a square-wave pulse of shorter duration, which measures only the interface trapped charge density.

Another prior art method to judge oxide quality is to measure the gate leakage current directly. A specific voltage value is applied to the gate of the non-volatile memory cell; the gate leakage current is thereafter measured. If the gate leakage current is greater than a predetermined spec, the quality of the oxide layer is not acceptable. If the gate leakage current is less than the predetermined spec, the quality of the oxide layer is okay.

However, the prior art methods for judging the quality of the oxide layer all have limitations regardless of which method is used, the C-V method, the charge pumping method or to directly measure the gate leakage current. When compared with other methods, the C-V method requires a MOS capacitor with larger area, is feasible only when the charge quantity is larger than a specific value, and adds to measuring difficulties by using a more complicated equation. In addition, the C-V method cannot be applied to a production line because the wafer acceptance testing equipment cannot measure capacitance. The strength of the charge pumping method includes being applicable to small-geometry MOS devices and to obtain the direct measurement of the charge pumping current that is proportional to interface-trapped charge density. However, an AC pulse generator is required to supply the gate voltage and a single value for an average interface trapped charge density is obtained, rather than the energy distribution of the interface trapped charge density.

Though the method to directly measure the gate leakage current is quite simple, the information obtained is very limited. A cycling test is necessary if attempts are made to observe the change of the memory cell. In other words, the steps of writing, erasing, and measuring are repeated many times with consuming a large amount of time. It is therefore very important to develop a new method to overcome the above mentioned problems and to be applied to the production line.

SUMMARY OF INVENTION

It is therefore a primary objective of the claimed invention to provide a method for monitoring the oxide quality, and more particularly, to a method for quickly monitoring the oxide quality in a device by measuring the stress-induced leakage current (SILC) with wafer acceptance testing (WAT) equipment.

According to the claimed invention, a semiconductor substrate is provided. At least one memory cell is formed on a surface of the semiconductor substrate. A first gate, a second gate, and a tunnel oxide layer from top to bottom in a stack are comprised in the memory cell.

The first gate and the second gate are then electrically connected. A first gate voltage is thereafter applied to the first gate; the first gate voltage is a swing time-dependent DC ramping voltage. After that, a first gate leakage current of the memory cell is measured and a first constant is calculated from an equation. A second gate voltage is then applied to the first gate; the second gate voltage is a swing time-dependent DC ramping voltage. Next, a second gate leakage current of the memory cell is measured and a second constant is calculated from the equation. A first ratio of the second constant to the first constant is calculated. Finally, a comparing step is performed to compare the value of the first ratio with a predetermined value.

It is an advantage of the claimed invention to examine the oxide layer quality in a flash ROM cell and in a MOS with a simple, fast, and automated in-line monitor by utilizing the wafer acceptance testing equipment in a clean room and a β-gate voltage curve. The claimed invention method is very sensitive to the intermediate charges trapped inside the oxide layer and at the oxide layer-silicon substrate interface and reflects the real-time change. A swing time-dependent DC ramping voltage is utilized to do the test, which exerts continuous stress fields to the oxide layer. The stress-induced leakage current (SILC) is therefore more readily produced to accurately simulate device failure when compared with the methods adopting single voltage value.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1A:
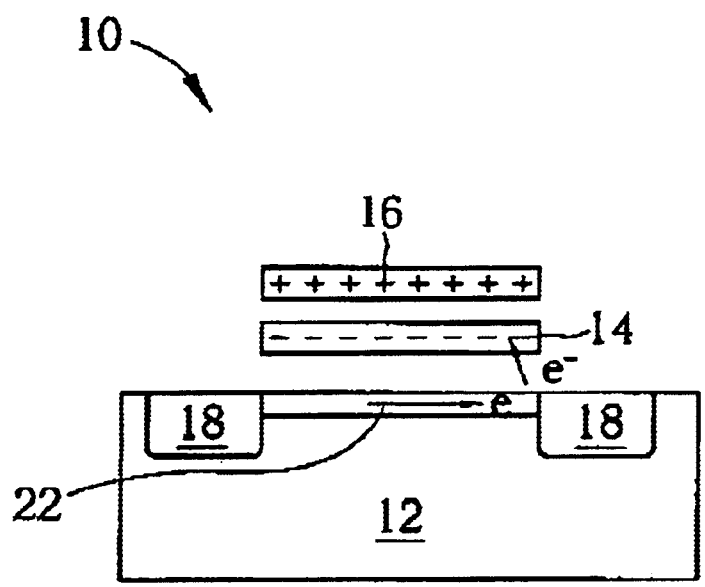
FIG. 1A and FIG. 1B are schematic diagrams of writing and erasing a flash ROM cell.
Figure 1B:
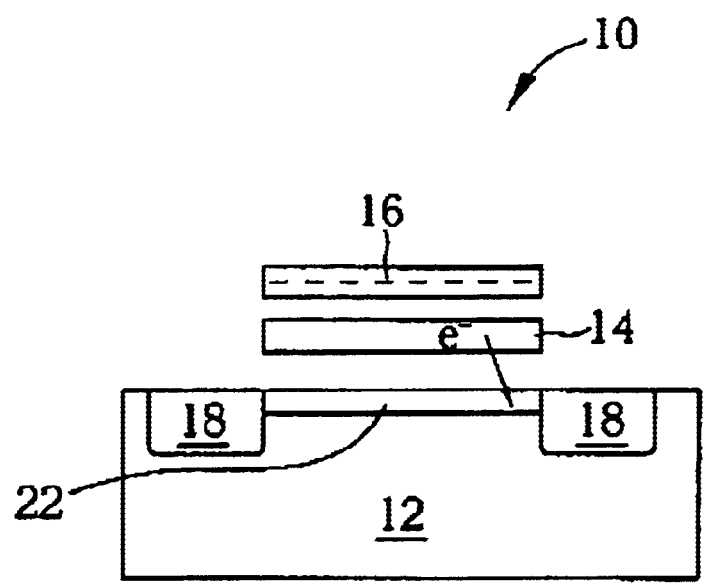
Figure 2A:
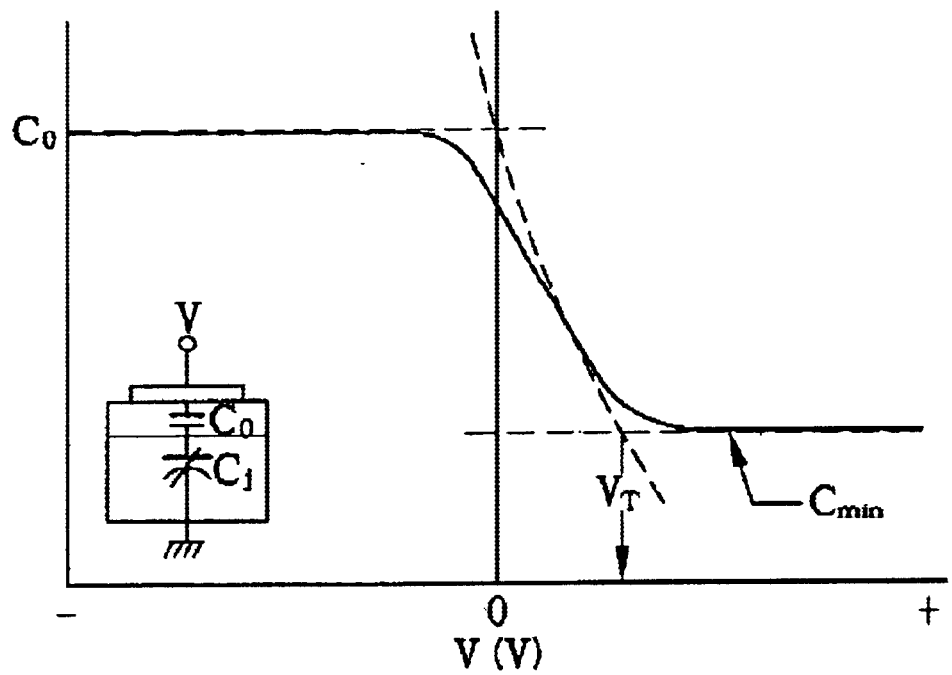
FIG. 2A and FIG. 2B are resultant diagrams for judging the oxide quality by utilizing a C-V method according to the prior art.
Figure 2B:
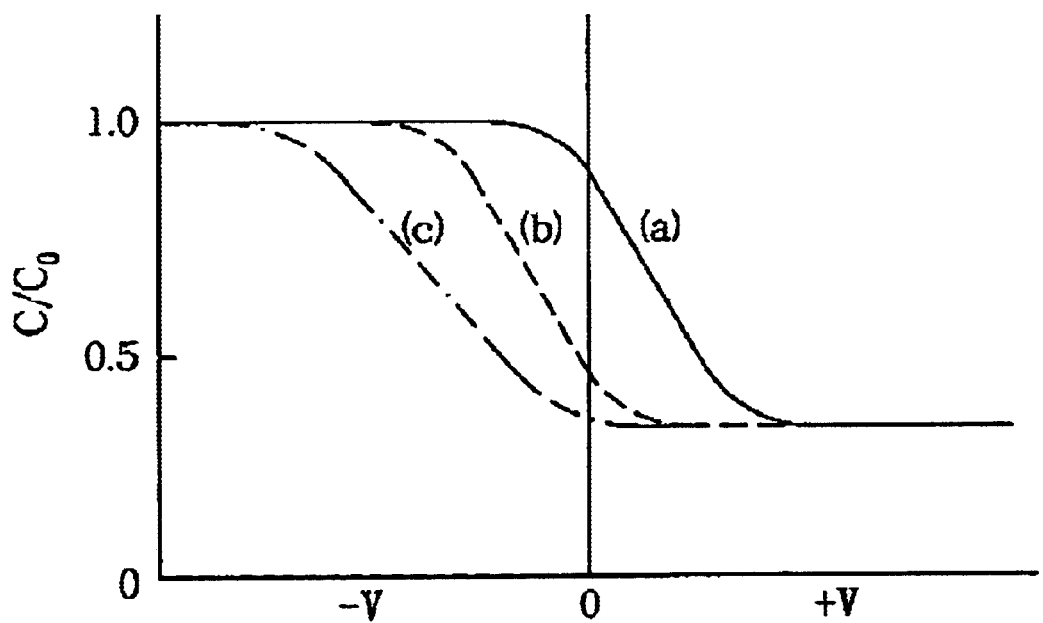
Figure 3:
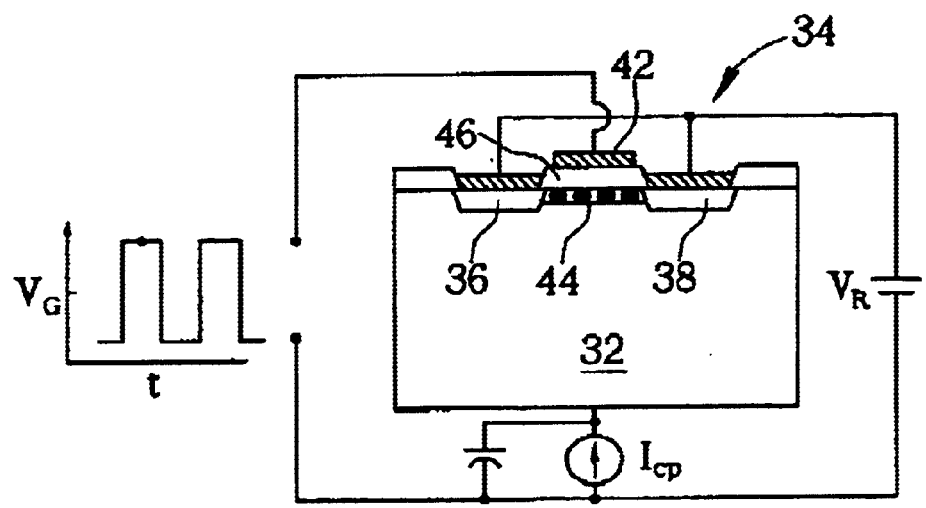
FIG. 3 is a schematic diagram of a charge pumping method for judging the oxide quality according to the prior art.
Figure 3:
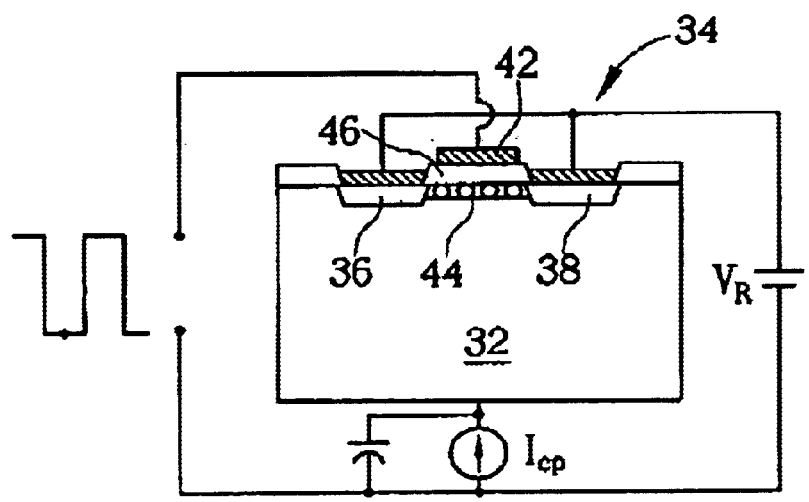
Figure 4:
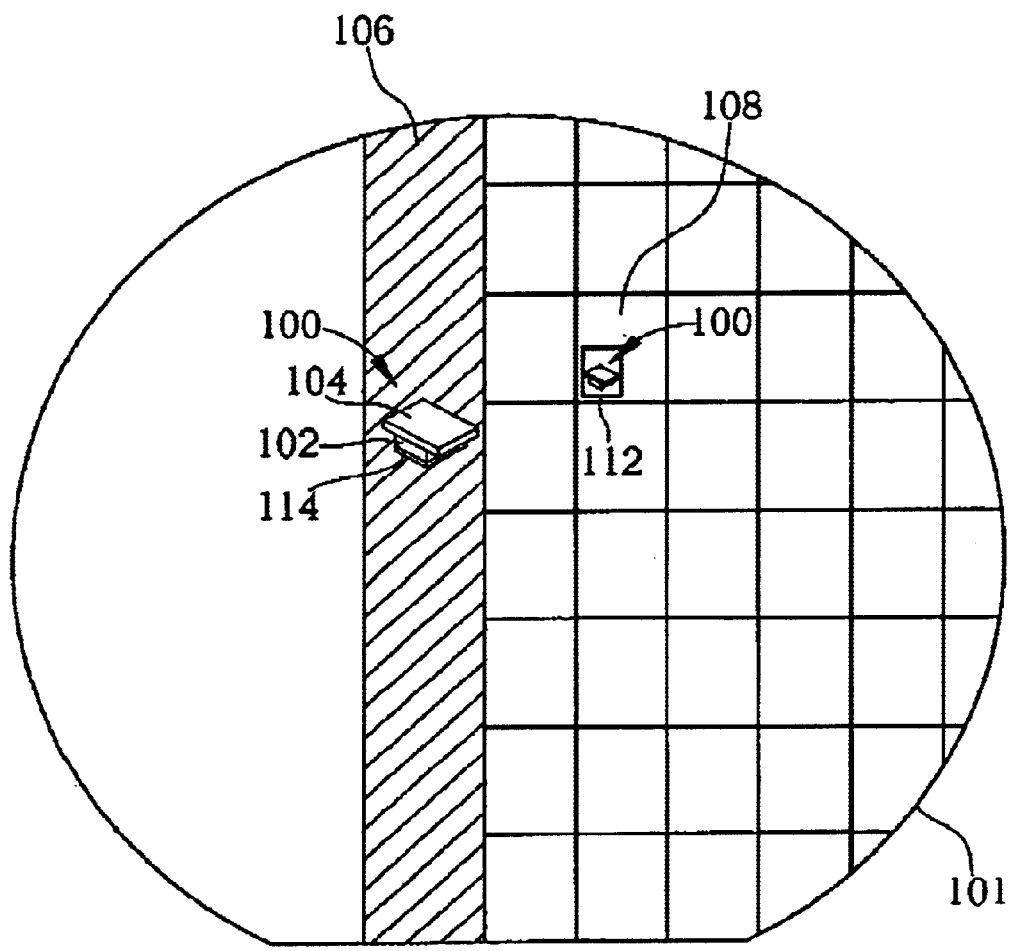
FIG. 4 is a schematic diagram of a method for monitoring the quality of an oxide layer in a flash ROM cell according to the present invention.
Figure 5:
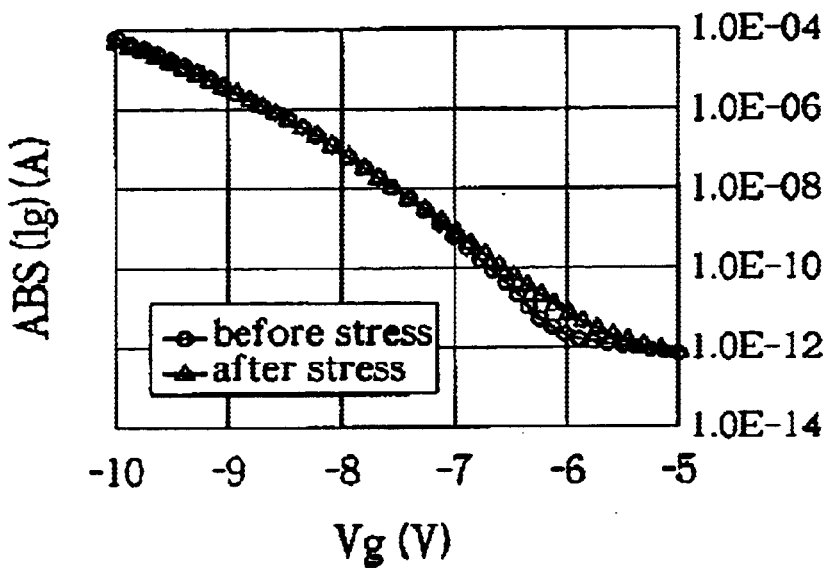
FIG. 5 is a gate current-gate voltage curve according to the present invention.
Figure 6:
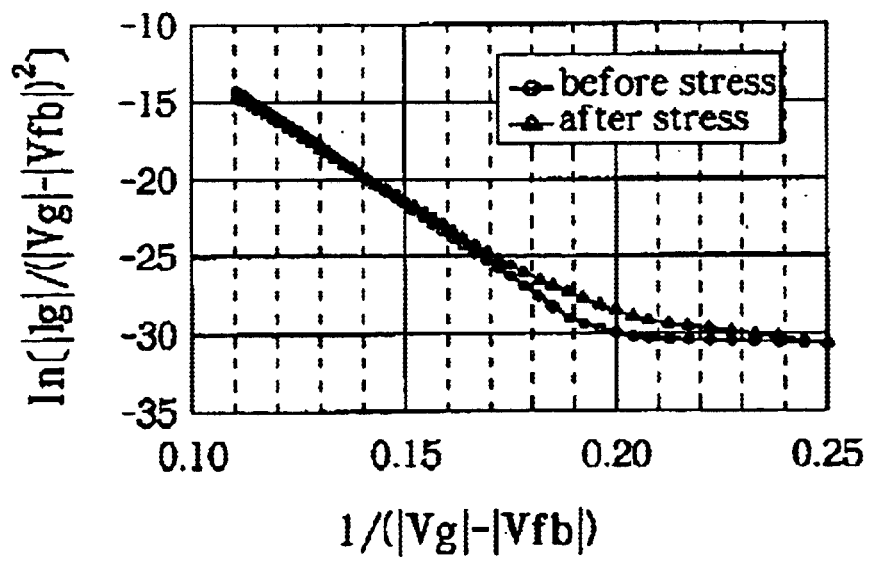
FIG. 6 is a curve for extracting β values according to the present invention.
Figure 7:
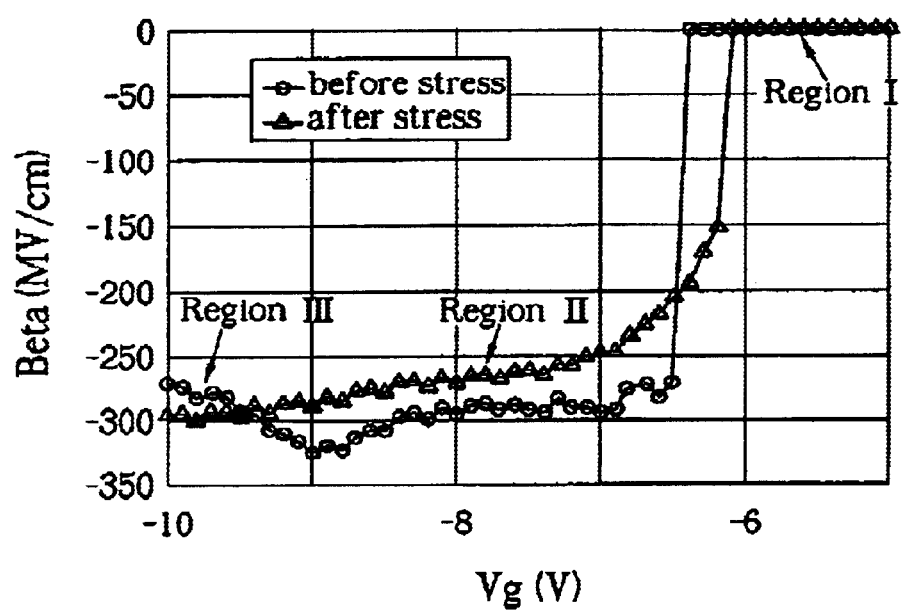
FIG. 7 is an extracted β value-gate voltage curve according to the present invention.
Figure 8:
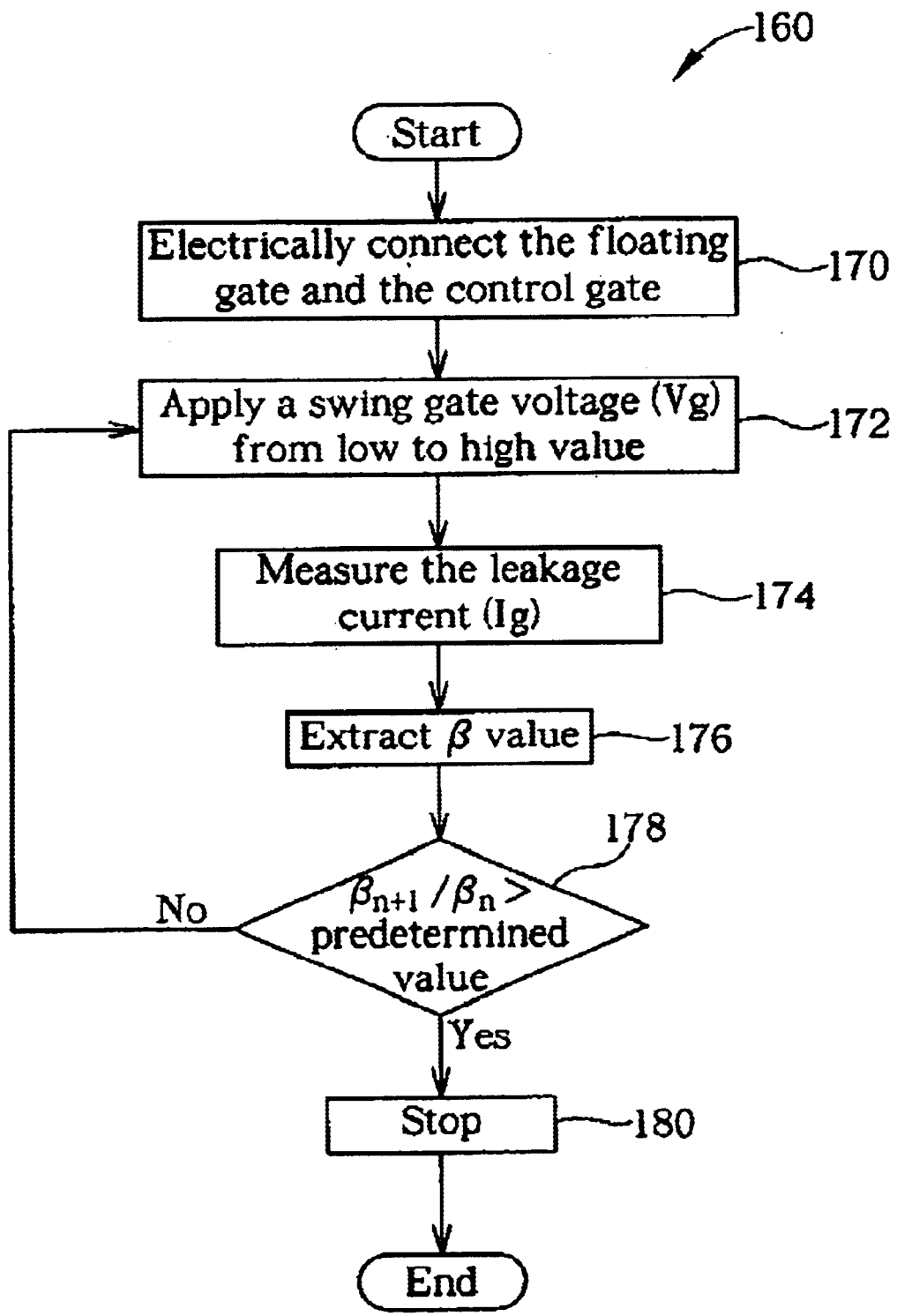
FIG. 8 is a flowchart of a method for monitoring oxide quality by utilizing wafer acceptance testing equipment to extract β values according to the present invention.

Please refer to FIG. 4 to FIG. 8. FIG. 4 is a schematic diagram of a method for monitoring the quality of an oxide layer in a flash ROM cell 100 according to the present invention. FIG. 5 is a gate current-gate voltage curve according to the present invention. FIG. 6 is a curve for extracting β values according to the present invention. FIG. 7 is an extracted β value-gate voltage curve according to the present invention. FIG. 8 is a flowchart 160 of a method for monitoring oxide quality by utilizing wafer acceptance testing equipment to extract β values.

The principle for monitoring the oxide quality according to the present invention is to utilize the Fowler-Nordheim tunneling mechanism equation. When the voltage difference across the oxide layer for the SiO$_2$—Si interface is greater than approximately 3.2V, the gate current (I$_g$) is due to Fowler-Nordheim tunneling. As shown in FIG. 4, an n-channel flash ROM cell 100 formed on a P-type substrate 101 is taken as an example.

First, a floating gate 102 is electrically connected (step 170) to a control gate 104 of the flash ROM cell 100. The method to electrically connect the floating gate 102 and the control gate 104 is to form the floating gate 102 and the control gate 104 in a testing area 106 on the P-type substrate 101, or to form the floating gate 102 and the control gate 104 on a test key 112 in a memory chip 108 on the P-type substrate 101. There is not any dielectric layer formed between the floating gate 102 and the control gate 104, and an oxide layer (here, an tunnel oxide layer) 114 is simultaneously formed between the floating gate 102 and the P-type substrate 101 when normal products are formed. The floating gate 102 and the control gate 104 are therefore successfully electrically connected without affecting the normal product area.

Then wafer acceptance testing equipment in a production line is utilized to apply a first gate voltage, which is one of the swing time-dependent negative DC ramping voltage, to the floating gate 102 and the control gate 104 (step 172). A first gate leakage current flowing through the floating gate 102 and the control gate 104 of the flash ROM cell 100 is thereafter measured (step 174). The gate leakage current is given by the Fowler-Nordheim tunneling mechanism equation:

$$I_g = \alpha E_{ox}^2 \exp(-\beta/E_{ox})$$

where

E$_{ox}$ denotes the oxide electric field strength, and

α and β denotes two constants.

When the voltage value applied to the floating gate 102 and the control gate 104 is negative, a surface of the P-type substrate 101 underneath the gate is in an accumulation mode. The oxide electric field strength is given by equation (1):

$$E_{ox} = (|V_g| - |V_{fb}|)/T_{ox} \qquad \text{(Equation 1)}$$

where

V$_{fb}$ donates the flatband voltage, and

T$_{ox}$ denotes the thickness of oxide layer.

By substituting the E$_{ox}$ in equation (1) into the Fowler-Nordheim tunneling mechanism equation, a new equation is obtained. The new equation is called as equation (2) so as to facilitate the description:

$$\ln[|I_g|/(|V_g|-|V_{fb}|)^2] = \ln(\alpha/t_{ox}^2) - \beta t_{ox}/(|V_g|-|V_{fb}|) \qquad \text{(Equation 2)}$$

After that, a production line wafer acceptance testing equipment is utilized to apply a second gate voltage that is one of the swing time-dependent negative DC ramping voltages to the floating gate 102 and the control gate 104 (step 172). The absolute value of the second gate voltage is greater than the absolute value of the first gate voltage. A second gate leakage current flowing through the floating gate 102 and the control gate 104 of the flash ROM cell 100 is then measured (step 174). By repeating the two steps (step 172 and step 174), the gate current-gate voltage curve (I$_g$-V$_g$ curve) shown in FIG. 5 is plotted. As shown in FIG. 5, a reference gate current-gate voltage curve (reference I$_g$-V$_g$ curve), representing the gate current-gate voltage curve for the oxide layer 114 in the flash ROM cell 100 that is not electric field stressed, is used for comparing with the measured gate current-gate voltage curve. In FIG. 5, it is not difficult to find that the measured gate current increases slightly in comparison with the reference curve when the value of the gate voltage is greater than 7 volts.

Almost at the same time when the curve in FIG. 5 is obtained, FIG. 6's results can be found by inputting equation (2) and parameters, such as the flatband voltage (V$_{fb}$) and the thickness of oxide layer (T$_{ox}$), into the wafer acceptance testing equipment. FIG. 6 is a curve for extracting β values according to the present invention. The axis of an ordinate represents the value of $\ln[|I_g|/(|V_g|-|V_{fb,l}|)^2]$, the axis of an abscissa represents the value of $1/(|V_g|-|V_{fb,l}|)$, and the slope for each point is equal to $-\beta T_{ox}$. By executing a step to extract a β value (step 176), an extracted β value-corresponding gate voltage curve as FIG. 7 is plotted. Owning to the continuously applied swing time-dependent negative DC ramping voltage, the oxide layer 114 is stressed. The intermediate trapped charges are thus generated gradually inside the oxide layer 114 and at the interface of the oxide layer 114 and the P-type substrate 101. Both are affected by electric field stress and result in stress-induced leakage current (SILC).

Three different regions are clearly observed in the curve in FIG. 7. Within the first region (region I), the β values are zero to represent each gate leakage current is less than 1.0×10$^{-11}$ A. While the absolute values of the β values within the second region (region II) start to increase, an obvious increase of the stress-induced leakage current is shown. Within the third region (region III), where a more negative voltage is applied to the gate, the absolute values of the β values increase more obviously (while the absolute values of the β values within the third region are greater than the absolute values of the β values within the second region), with the β values even crossing the none electric field stressed β value-gate voltage curve and represents carriers trapped and the intermediate trapped charges.

Almost at the same time when the results in FIG. 7 are found, a comparison step is performed. A ratio is obtained by dividing the β value with the previous β value. For example, the β value corresponding to the second gate voltage is divided by the β value corresponding to the first gate voltage. The ratio is then compared with a predetermined value (step 178). The magnitude of the predetermined value is dependent on the spec for each product, and the predetermined value for the present invention flash ROM cell is 10. If the ratio is greater than the predetermined value, the quality of the oxide layer 114 is out of spec and a stop step (step 180) is performed. If the ratio is smaller than the predetermined value, step 172 is performed.

As shown in FIG. 8, the flowchart 160 of a method for monitoring oxide quality by utilizing wafer acceptance testing equipment to extract β values according to the present invention comprises the following steps:

Step 170.

Electrically connect the floating gate and the control gate of the flash ROM cell;

Step 172.

Apply a swing time-dependent negative DC ramping voltage, from low to high value, to the floating gate and the control gate;

Step 174.

Measure the leakage current flowing through the floating gate and the control gate of the flash ROM cell;

Step 176.

Executing a β value extracting step;

Step 178.

Perform a comparing step, if the ratio is greater than the predetermined value, go to step 180; if the ratio is smaller than the predetermined value, go to step 172; and Step 180.

Perform a stop step.

The present invention method can also be applied to a metal-oxide-semiconductor (MOS). When monitoring the quality of an oxide layer (here, a gate oxide layer) in a MOS, the step of electrically connecting the floating gate and the control gate (step 170) is omitted since the MOS is a single gate device. Other steps are the same as the steps for monitoring the oxide layer in the flash ROM cell and shown in FIG. 8.

The present invention method for monitoring the oxide layer quality in the flash ROM cell and in the MOS is to simply and quickly monitor the intermediate trapped charges in the oxide layer and at the oxide layer-silicon substrate interface using the wafer acceptance testing equipment in a clean room and the β-gate voltage curve. The present invention method is very sensitive to the generated intermediate trapped charges, and reflects the actual situation rapidly. In addition, the present invention method utilizes a swing time-dependent DC ramping voltage, which exerts continuous stress fields to the oxide layer. Hence, the stress-induced leakage current (SILC) more readily occurs to accurately simulate device failure when compared with the methods adopting a single voltage value.

In contrast to the prior art method for monitoring the oxide layer quality in the flash ROM cell and in the MOS, the present invention method for monitoring the oxide layer quality in the memory cell and in the MOS is to utilize the wafer acceptance testing equipment in a clean room and the β-gate voltage curve to do in-line monitoring. The stress of the present invention method is simple, fast, and readily automated. In addition, the present invention is very sensitive to the intermediate trapped charges inside the oxide layer and at the oxide layer-silicon substrate interface so that a real-time change is reflected. Because a swing time-dependent DC ramping voltage, which exerts continuous stress fields to the oxide layer is utilized to do the test, the stress-induced leakage current (SILC) more readily occurs when compared with the methods adopting a single voltage value, accurately simulating device failure without spending a lot of time.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for monitoring a tunnel oxide layer, the method comprising:

(a) providing a semiconductor substrate and forming at least one memory cell on a surface of the semiconductor substrate, the memory cell comprising a first gate, a second gate, and the tunnel oxide layer from top to bottom in a stack;

(b) electrically connecting the first gate and the second gate;

(c) applying a first gate voltage to the first gate, the first gate voltage being a swing time-dependent DC ramping voltage;

(d) measuring a first gate leakage current of the memory cell to calculate a first constant from an equation;

(e) applying a second gate voltage to the first gate, the second gate voltage being a swing time-dependent DC ramping voltage;

(f) measuring a second gate leakage current of the memory cell to calculate a second constant from the equation;

(g) calculating a first ratio of the second constant to the first constant; and (h) performing a comparing step to compare the value of the first ratio with a predetermined value.

2. The method of claim 1 wherein the semiconductor substrate is a silicon substrate of a semiconductor wafer and the memory cell is formed in a testing area of the semiconductor wafer.

3. The method of claim 1 wherein the memory cell is a flash memory cell, the first gate and the second gate are a controlling gate and a floating gate of the flash memory cell respectively.

4. The method of claim 1 wherein the memory cell is a non-volatile memory cell, the first gate and the second gate are a controlling gate and a floating gate of the non-volatile memory cell respectively.

5. The method of claim 1 wherein the quality of the tunnel oxide layer is degenerated to be not acceptable when the value of the first ratio is greater than the predetermined value.

6. The method of claim 1 wherein the equation is the Fowler-Nordheim tunneling mechanism equation.

7. The method of claim 1 wherein the predetermined value is 10.

8. The method of claim 1 wherein each constant is a β value corresponding to each gate voltage respectively.

9. The method of claim 8 wherein the first constant is a β 1 value corresponding to the first gate voltage and the β 1 value is equal to $[\{\Delta \ln[|\text{the first gate leakage current}|/(|\text{the first gate voltage}|-|\text{a flatband voltage}(V_{fb})|)^2]\}^+ \{\Delta[1^+\text{first gate voltage}|-|\text{the flatband voltage}|)]\}]$.

10. The method of claim 8 wherein the second constant is a β 2 value corresponding to the second gate voltage and the β 2 value is equal to [{Δ In[|the second gate leakage current|/|the second gate voltage|−|the flatband voltage($V_{fb}$)|)$^2$]}$^+${Δ[1$^+$(|the second gate voltage|−|the flatband voltage|)]}].

11. The method of claim 8 further comprising the following steps when the value of the first ratio is not greater than the predetermined value:
   applying a third gate voltage to the first gate, the third gate voltage is a swing time-dependent DC ramping voltage;
   measuring a third gate leakage current of the memory cell to calculate a third constant from the equation;
   calculating a second ratio of the third constant to the second constant; and
   performing the comparing step to compare the value of the second ratio with the predetermined value.

12. The method of claim 11 wherein the steps (c) to (h) are repeated when the value of the second ratio is not greater than the predetermined value.

13. The method of claim 11 wherein the quality of the tunnel oxide layer is degenerated to be not acceptable when the value of the second ratio is greater than the predetermined value.

14. The method of claim 11 wherein the third constant is a β 3 value corresponding to the third gate voltage, the β 3 value is equal to [{Δ In[|the third gate leakage current|/(|the third gate voltage|−|a flatband voltage($V_{fb}$)|)$^2$]}$^+${Δ[1$^+$(|the third gate voltage|−|the flatband voltage|)]}].

15. The method of claim 14 further comprising a step for plotting a β-$V_g$ curve of each β value respectively corresponding to the first gate voltage, the second gate voltage and the third gate voltage versus the first gate voltage, the second gate voltage and the third gate voltage, a reference β-$V_g$ curve for the unstress-induced tunnel oxide layer in the memory cell is compared with the β-$V_g$ curve to monitor the quality of the tunnel oxide layer.

16. The method of claim 15 wherein the β-$V_g$ curve comprises at least a first region (region I), a second region (region II), and a third region (region III).

17. The method of claim 16 wherein the β value within the first region is zero to represent each gate leakage current flowing through the first gate and the second gate in the memory cell being less than a predetermined current value, the absolute value of the β value within the second region increases to represent the stress-induced leakage current (SILC) resulting in the increase of each gate leakage current of the memory cell, the β value within the third region crosses the reference β-$V_g$ curve to represent a plurality of carriers being trapped by the tunnel oxide layer.

18. The method of claim 17 wherein the predetermined current value is $1.0 \times 10^{-11}$ A.

19. The method of claim 8 further comprising a step for plotting a β-$V_g$ curve of each β value versus each gate voltage, a reference β-$V_g$ curve for the unstress-induced tunnel oxide layer in the memory cell is compared with the β-$V_g$ curve to monitor the quality of the tunnel oxide layer.

20. The method of claim 1 wherein the method is applied to a wafer acceptance testing (WAT) equipment to fast monitor the stress-induced degradation of the tunnel oxide layer in the memory cell.

21. A method for fast monitoring the stress-induced degradation of an oxide layer by a wafer acceptance testing (WAT) equipment, the method comprising:
   (a) providing a semiconductor substrate, a surface of the semiconductor substrate comprising the oxide layer and a first gate disposed on the oxide layer;
   (b) applying a first gate voltage to the first gate, the first gate voltage being a swing time-dependent DC ramping voltage;
   (c) measuring a first gate leakage current flowing through the first gate to calculate a first proportional value from the first gate voltage, the first gate leakage current, and an equation, the first proportional value corresponding to the first gate voltage;
   (d) applying a second gate voltage to the first gate, the second gate voltage being a swing time-dependent DC ramping voltage;
   (e) measuring a second gate leakage current flowing through the first gate to calculate a second proportional value from the second gate voltage, the second gate leakage current, and the equation, the second proportional value corresponding to the second gate voltage; and
   (f) calculating a first ratio of the second proportional value to the first proportional value.

22. The method of claim 21 wherein the semiconductor substrate is a silicon substrate of a semiconductor wafer and the first gate is formed in a testing area of the semiconductor wafer.

23. The method of claim 21 wherein a second gate is formed between the first gate and the oxide layer.

24. The method of claim 23 further comprising an electrically connecting step performed before applying the first gate voltage to the first gate to electrically connect the first gate and the second gate.

25. The method of claim 24 wherein the memory cell is a flash memory cell, the first gate and the second gate are a controlling gate and a floating gate of the flash memory cell respectively.

26. The method of claim 24 wherein the first gate is a controlling gate of the flash memory cell, the second gate is a floating gate of the flash memory cell, the oxide layer is a tunnel oxide layer of the flash memory cell.

27. The method of claim 21 wherein the first gate is a gate of a metal-oxide-semiconductor (MOS) transistor, the oxide layer is a gate oxide layer of the MOS transistor.

28. The method of claim 21 further comprising a comparing step to compare the value of the first ratio with a predetermined value.

29. The method of claim 28 wherein the quality of the tunnel oxide layer is degenerated to be not acceptable when the value of the first ratio is greater than the predetermined value.

30. The method of claim 28 wherein the predetermined value is 10.

31. The method of claim 21 wherein the equation is the Fowler-Nordheim tunneling mechanism equation.

32. The method of claim 21 wherein each proportional value is a β value corresponding to each gate voltage respectively.

33. The method of claim 32 wherein the first proportional value is a β 1 value corresponding to the first gate voltage and the β 1 value is equal to [{Δ In[|the first gate leakage current|/(|the first gate voltage|−|a flat band voltage($V_{fb}$)|)$^2$]}÷{Δ[1÷(|the first gate voltage|−|the flat band voltage|)]}].

34. The method of claim 32 wherein the second proportional value is a β 2 value corresponding to the second gate voltage and the β 2 value is equal to [{Δ In[|the second gate leakage current|/(|the second gate voltage|−|the flatband voltage ($V_{fb}$)|)$^2$]}$^+${Δ[1$^+$(|the second gate voltage|−|the flatband voltage|)]}.

35. The method of claim 32 further comprising the following steps when the value of the first ratio is not greater than the predetermined value:

applying a third gate voltage to the first gate, the third gate voltage is a swing time-dependent DC ramping voltage;

measuring a third gate leakage current flowing through the first gate;

calculating a third proportional value from the third gate voltage, the third gate leakage current, and the equation, the third proportional value corresponding to the third gate voltage;

calculating a second ratio of the third proportional value to the second proportional value; and performing the comparing step to compare the value of the second ratio with the predetermined value.

36. The method of claim 35 wherein the steps (b) to (f) are repeated when the value of the second ratio is not greater than the predetermined value.

37. The method of claim 35 wherein the quality of the oxide layer is degenerated to be not acceptable when the value of the second ratio is greater than the predetermined value.

38. The method of claim 35 wherein the third proportional value is a $\beta 3$ value corresponding to the third gate voltage, the $\beta 3$ value is equal to $[\{\Delta \ln[|\text{the third gate leakage current}|/(|\text{the third gate voltage}|-|\text{a flatband voltage}(V_{fb})|)^2]\}\div\{\Delta[1\div(|\text{the third gate voltage}|-|\text{the flatband voltage}|)]\}]$.

39. The method of claim 38 further comprising a step for plotting a $\beta$-$V_g$ curve of each $\beta$ value respectively corresponding to the first gate voltage, the second gate voltage and the third gate voltage versus the first gate voltage, the second gate voltage and the third gate voltage, a reference $\beta$-$V_g$ curve for the unstress-induced oxide layer is compared with the $\beta$-$V_g$ curve to monitor the quality of the oxide layer.

40. The method of claim 39 wherein the $\beta$-$V_g$ curve comprises at least a first region (region I), a second region (region II), and a third region (region III).

41. The method of claim 40 wherein the $\beta$ value within the first region is zero to represent each gate leakage current flowing through the first gate being less than a predetermined current value, the absolute value of the $\beta$ value within the second region increases to represent the stress-induced leakage current (SILC) resulting in the increase of each gate leakage current flowing through the first gate, the $\beta$ value within the third region crosses the reference $\beta$-$V_g$ curve to represent a plurality of carriers being trapped by the oxide layer.

42. The method of claim 41 wherein the predetermined current value is $1.0\times10^{-11}$ A.

43. The method of claim 32 further comprising a step for plotting a $\beta$-$V_g$ curve of each $\beta$ value versus each gate voltage, a reference $\beta$-$V_g$ curve for the unstress-induced tunnel oxide layer in the memory cell is compared with the $\beta$-$V_g$ to monitor the quality of the tunnel oxide layer.

* * * * *

UNITED STATES PATENT AND TRADEMARK OFFICE
CERTIFICATE OF CORRECTION

PATENT NO. : 6,894,517 B2 Page 1 of 1
APPLICATION NO. : 10/065432
DATED : May 17, 2005
INVENTOR(S) : Ting-Kuo Kang et al.

It is certified that error appears in the above-identified patent and that said Letters Patent is hereby corrected as shown below:

Please replace the title METHOD FOR MONITORING OXIDE QUALITY with the following new title:

METHOD OF MANUFACTURING A SEMICONDUCTOR DEVICE HAVING AN OXIDE LAYER

Signed and Sealed this

Fifth Day of September, 2006

JON W. DUDAS
*Director of the United States Patent and Trademark Office*